US012745599B2

(12) United States Patent
Ikedo

(10) Patent No.: US 12,745,599 B2
(45) Date of Patent: Sep. 22, 2026

(54) TRANSPORT FACILITY

(71) Applicant: Daifuku Co., Ltd., Osaka (JP)

(72) Inventor: Kengo Ikedo, Komaki (JP)

(73) Assignee: Daifuku Co., Ltd., Osaka (JP)

( * ) Notice: Subject to any disclaimer, the term of this patent is extended or adjusted under 35 U.S.C. 154(b) by 335 days.

(21) Appl. No.: 18/666,914

(22) Filed: May 17, 2024

(65) Prior Publication Data

US 2024/0383507 A1 Nov. 21, 2024

(30) Foreign Application Priority Data

May 19, 2023 (JP) ................................ 2023-082932

(51) Int. Cl.

| | |
|---|---|
| ***H10P 72/30*** | (2026.01) |
| ***B61B 3/02*** | (2006.01) |
| ***B61B 10/00*** | (2006.01) |
| ***B61B 13/12*** | (2006.01) |
| ***B65G 35/06*** | (2006.01) |
| ***G05D 1/43*** | (2024.01) |

(52) U.S. Cl.

CPC ........... *H10P 72/3214* (2026.01); *B61B 3/02* (2013.01); *B61B 10/001* (2013.01); *B61B 13/12* (2013.01); *B65G 35/06* (2013.01); *G05D 1/43* (2024.01); *H10P 72/3208* (2026.01); *H10P 72/3218* (2026.01); *H10P 72/3221* (2026.01)

(58) Field of Classification Search

CPC ......... B61B 3/02; B61B 13/12; B61B 10/001; H10P 72/3214; H10P 72/3218; H10P 72/3221; H10P 72/3208; G05D 1/43

See application file for complete search history.

(56) References Cited

U.S. PATENT DOCUMENTS

| | | | | |
|---|---|---|---|---|
| 6,860,209 | B2 * | 3/2005 | McKoy | B63H 19/00 104/73 |
| 11,367,637 | B2 * | 6/2022 | Chu | H10P 72/06 |
| 11,404,298 | B2 * | 8/2022 | Takahara | B61L 23/14 |
| 11,476,141 | B2 * | 10/2022 | Ito | B61B 3/02 |
| 2016/0332523 | A1 * | 11/2016 | Wada | B60L 5/005 |
| 2017/0166406 | A1 * | 6/2017 | Horii | G05B 19/4189 |
| 2022/0105966 | A1 * | 4/2022 | Jun | B61B 3/02 |

(Continued)

FOREIGN PATENT DOCUMENTS

| | | | | |
|---|---|---|---|---|
| JP | 2016196359 | A * | 11/2016 | B65G 49/061 |
| JP | 2019185499 | A | 10/2019 | |
| JP | 202030723 | A | 2/2020 | |

(Continued)

*Primary Examiner* — Cheng Lin
(74) *Attorney, Agent, or Firm* — The Webb Law Firm

(57) ABSTRACT

A transport facility includes at least one transport vehicle, a guide rail, and a control system, and the at least one transport vehicle includes a guide section that is guided by the guide rail. The control system, when controlling the at least one transport vehicle traveling on the first branch route to perform return travel for entering the second branch route after reversing, executes branch return control for (i) controlling the guide drive section to move the guide section located at a first position to a second position side while the at least one transport vehicle is reversing on the first branch route, and (ii) controlling at least one transport vehicle to move forward on condition that the guide section has moved to the second position.

8 Claims, 4 Drawing Sheets

(56) References Cited

U.S. PATENT DOCUMENTS

| | | | | |
|---|---|---|---|---|
| 2023/0259141 A1* | 8/2023 | Harasaki | ............. | G05D 1/0027 701/23 |

FOREIGN PATENT DOCUMENTS

| | | | | | |
|---|---|---|---|---|---|
| JP | 202272555 | A | | 5/2022 | |
| JP | 2022173782 | A | * | 11/2022 | |
| KR | 20020021357 | A | * | 3/2002 | ............. E01B 25/06 |
| KR | 20140084387 | A | * | 7/2014 | ............. B65G 35/06 |
| KR | 20170007115 | A | * | 1/2017 | .......... H10P 72/3221 |
| KR | 20210072302 | A | * | 6/2021 | ....... H01L 21/67733 |
| TW | 201331106 | A | * | 8/2013 | .......... H10P 72/3221 |
| WO | 2022014116 | A1 | | 1/2022 | |

* cited by examiner

A
1B
M9
30
1D
P3
1A
P0
1A
1A
B
M5
M7
M6
32
P4
P2
31
1A
1A
P1,P3
P5
1C
M8
1A 6
41
1
F
21
D1
14
22
6
MR
42
F
31
7
P2
C1
30

6
41
F
6
42
F
1
MF
7
1
31
21
D2
14
22
C1
30

52
6
1
14
F
51
F
6
21
22
D1
MF
32
7
P4
C2
30

52
6
F
51
F
6
1
MR
32
7
1
D2
22
21
14
C2
30

TRANSPORT FACILITY

CROSS-REFERENCE TO RELATED APPLICATION

This application claims priority to Japanese Patent Application No. 2023-082932 filed May 19, 2023, the disclosure of which is hereby incorporated by reference in its entirety.

BACKGROUND OF THE INVENTION

1. Field of the Invention

The present invention relates to a transport facility provided with transport vehicles that travel along a travel route, a guide rail provided along the travel route, and a control system that controls the transport vehicles.

2. Description of the Related Art

An example of a transport facility is disclosed in WO 2022/014116 (Patent Document 1). In this description of the related art, reference numerals of Patent Document 1 are cited in parentheses. The transport facility disclosed in Patent Document 1 includes traveling vehicles (5) that transport articles by traveling along a track (11) and a traveling vehicle controller (3) that controls the traveling vehicles (5). When a transport command is generated, a travel control unit (41) provided in the traveling vehicle controller (3) searches for a travel route to a station (ST) included in the transport command, and controls the traveling vehicles (5) to travel along the travel route.

With the transport facility of Patent Document 1, in addition to one-way travel control for controlling the traveling vehicles (5) to travel in one direction, the travel control unit (41) executes return travel control for controlling the traveling vehicles (5) to travel in the reverse direction to the one direction. For example, in the situation shown in FIG. 3(A) of Patent Document 1, a traveling vehicle (5A) is controlled to move forward from the current position to a specific point (SP) and then reverse from the specific point (SP) to a station (ST1). Also, in the situation shown in FIG. 5 of Patent Document 1, a traveling vehicle (5B) is controlled to reverse from a station (ST2) to a specific point (SP) and then move forward from the specific point (SP).

As described above, with the transport facility of Patent Document 1, when return travel control is executed, travel of the transport vehicles (traveling vehicles in Patent Document 1) is controlled to return at a return position (specific points in Patent Document 1). In view of improving the transport efficiency of articles, it is desirable to keep the distance that the transport vehicles travel during such return travel as short as possible. However, Patent Document 1 contains no disclosure in this regard.

SUMMARY OF THE INVENTION

In view of the above, it is desired to realize a transport facility in which the travel distance of transport vehicles during return travel is readily kept short.

As one mode, a transport facility according to the present disclosure includes at least one transport vehicle configured to travel along a travel route, a guide rail provided along the travel route, and a control system configured to control the at least one transport vehicle. When a direction along the travel route is defined as a travel direction, and a direction orthogonal to the travel direction as viewed vertically is defined as a width direction, the at least one transport vehicle includes a guide section configured to be guided by the guide rail by contacting the guide rail from one side in the width direction, and a guide drive section configured to move the guide section in the width direction. The travel route includes a branch portion branching from a single route into a first branch route and a second branch route, the guide rail is provided in the branch portion and is not provided in a branch upstream segment upstream of the branch portion, and the at least one transport vehicle is configured to perform forward movement for traveling along the travel route in a forward direction and reverse movement for traveling along the travel route in a reverse direction to the forward direction. Also, when a position of the guide section in the width direction for entering the first branch route is defined as a first position, and a position of the guide section in the width direction for entering the second branch route is defined as a second position, the control system, when controlling the at least one transport vehicle traveling on the first branch route to perform return travel for entering the second branch route after reversing, executes branch return control for (i) controlling the guide drive section to move the guide section located at the first position to the second position side while the at least one transport vehicle is reversing on the first branch route, and (ii) controlling the at least one transport vehicle to move forward on condition that the guide section has moved to the second position.

In a configuration in which the guide rail is provided in the branch portion and is not provided in the branch upstream segment, it is necessary, when controlling the transport vehicle traveling on the first branch route to perform return travel for entering the second branch route after reversing, to control the transport vehicle traveling on the first branch route to reverse back to the branch upstream segment, in order to switch the position of the guide section in the width direction from the first position to the second position. According to this configuration, in response to the transport vehicle being controlled to perform the above-described return travel, the guide drive section is controlled to move the guide section located at the first position to the second position side while the transport vehicle is reversing on the first branch route. Thus, in response to the transport vehicle entering the branch upstream segment and the guide rail ends, the guide section moves from the first position to the second position. That is, with a relatively simple configuration in which the guide drive section is controlled to move the guide section located at the first position to the second position side while the transport vehicle is reversing on the first branch route, the guide section can be moved to the second position when near the downstream end of the branch upstream segment. The transport vehicle is then controlled to move forward on condition that the guide section has thus moved to the second position. Accordingly, the direction in which the transport vehicle travels is readily switched from reverse to forward at a position near the downstream end of the branch upstream segment, and the travel distance of the transport vehicle during return travel is readily kept short. According to this configuration, it is thus possible to realize a transport facility in which the travel distance of transport vehicles during return travel is readily kept short.

As another mode, the transport facility according to the present disclosure includes at least one transport vehicle configured to travel along a travel route, a guide rail provided along the travel route, and a control system configured to control the at least one transport vehicle. When a direction along the travel route is defined as a travel direction, and a direction orthogonal to the travel direction as viewed vertically is defined as a width direction, the at least one transport vehicle includes a guide section configured to be guided by the guide rail by contacting the guide rail from one side in the width direction, and a guide drive section configured to move the guide section in the width direction. The travel route includes a merge portion where a first merge route and a second merge route merge into a single route, the guide rail is provided in the merge portion and is not provided in a merge downstream segment downstream of the merge portion, and the at least one transport vehicle is configured to perform forward movement for traveling along the travel route in a forward direction and reverse movement for traveling along the travel route in a reverse direction to the forward direction. Also, when a position of the guide section in the width direction for traveling on the first merge route is defined as a first position, and a position of the guide section in the width direction for traveling on the second merge route is defined as a second position, the control system, when controlling the at least one transport vehicle traveling on the first merge route to perform return travel for entering the second merge route after moving forward, executes merge return control for (i) controlling the guide drive section to move the guide section located at the first position to the second position side while the at least one transport vehicle is moving forward on the first merge route, and (ii) controlling the at least one transport vehicle to reverse on condition that the guide section has moved to the second position.

In a configuration in which the guide rail is provided in the merge section and is not provided in the merge downstream segment, it is necessary, when controlling the transport vehicle traveling on the first merge route to perform return travel for entering the second merge route after moving forward, to control the transport vehicle traveling on the first merge route to move forward to the merge downstream segment, in order to switch the position of the guide section in the width direction from the first position to the second position. According to this configuration, in response to the transport vehicle being controlled to perform the above-described return travel, the guide drive section is controlled to move the guide section located at the first position to the second position side while the transport vehicle is moving forward on the first merge route. Thus, in response to the transport vehicle entering the merge downstream segment and the guide rail ending, the guide section moves from the first position to the second position. That is, with a relatively simple configuration in which the guide drive section is controlled to move the guide section located at the first position to the second position side while the transport vehicle is moving forward on the first merge route, the guide section can be moved to the second position when near the upstream end of the merge downstream segment. The transport vehicle is then controlled to reverse on condition that the guide section has thus moved to the second position. Accordingly, the direction in which the transport vehicle travels is readily switched from forward to reverse at a position near the upstream end of the merge downstream segment, and the travel distance of the transport vehicle during return travel is readily kept short. According to this configuration, it is thus possible to realize a transport facility in which the travel distance of transport vehicles during return travel is readily kept short.

Other features and advantages of the present invention will become apparent from the following description of embodiments with reference to the drawings.

DESCRIPTION OF THE INVENTION

Figure 1:
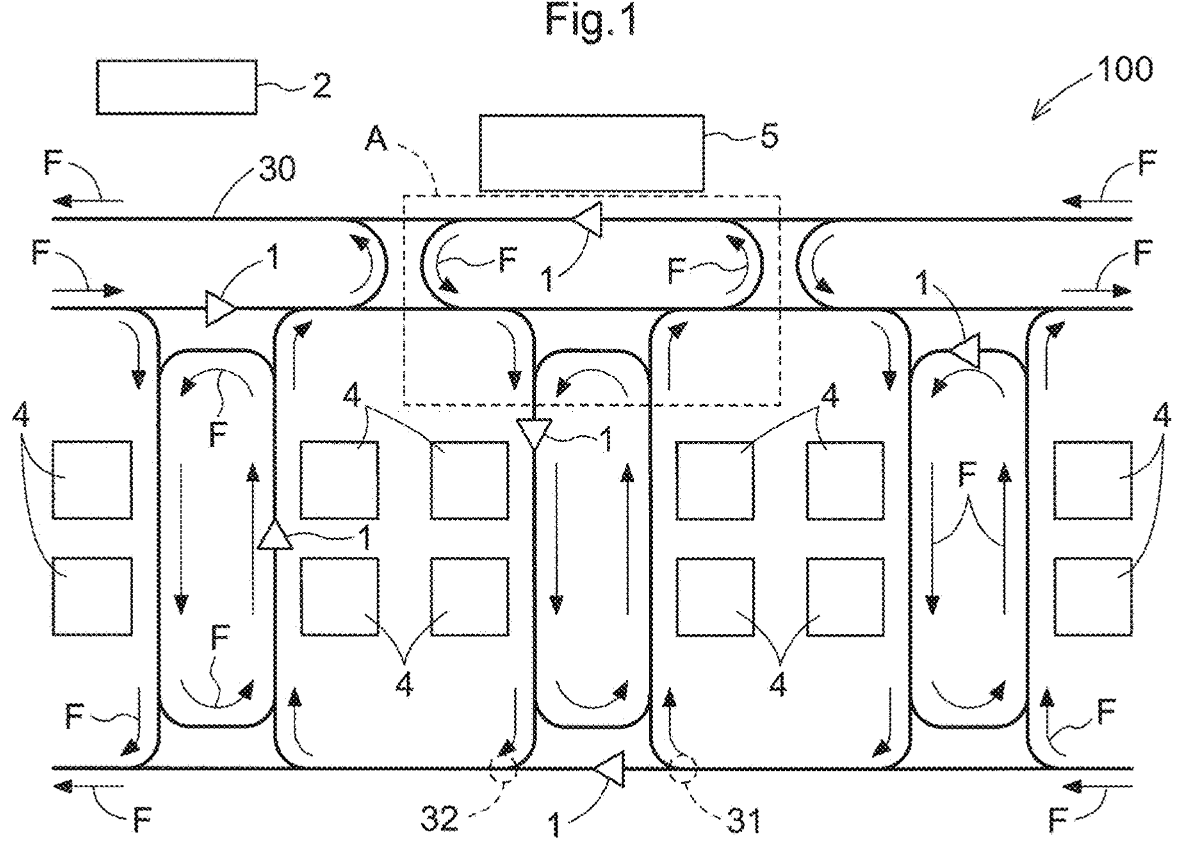
FIG. 1 shows an example of a transport facility.

An embodiment of a transport facility will now be described with reference to the drawings. As shown in simplified form in FIG. 1, a transport facility 100 includes at least one transport vehicle 1 that travels along a travel route 30, a guide rail 7 (see FIG. 2) that runs along the travel route 30, and a control system 2 that controls the one or more transport vehicles 1. In the present embodiment, the transport facility 100 includes a plurality of transport vehicles 1. The travel route 30 is the entire travel route of the transport vehicles 1, and is constituted by a set of routes (partial routes).

The functions of the control system 2 are, for example, realized by cooperation between hardware such as a computational processing device and a program that is executed on the hardware. The control system 2 may be entirely provided in the transport vehicles 1, or may be provided partially in the transport vehicles 1 and partially in an external control device (control device provided outside the transport vehicles 1 and capable of communicating with the transport vehicles 1). The control system 2 may also be entirely provided in an external control device. Here, the external control device need not be a single device, and may be a set of devices that can communicate with each other.

The transport vehicles 1 each include a controller (device controller) that controls a travel drive section 13 and a guide drive section 20 described later. When the control system 2 is at least partially provided in an external control device, the controller included in the transport vehicles 1 operate in accordance with commands from the external control device. Also, when the control system 2 is at least partially provided in the transport vehicles 1, the controller included in the transport vehicles 1 may constitute the part of the control system 2 provided in the transport vehicles 1.

Figure 2:
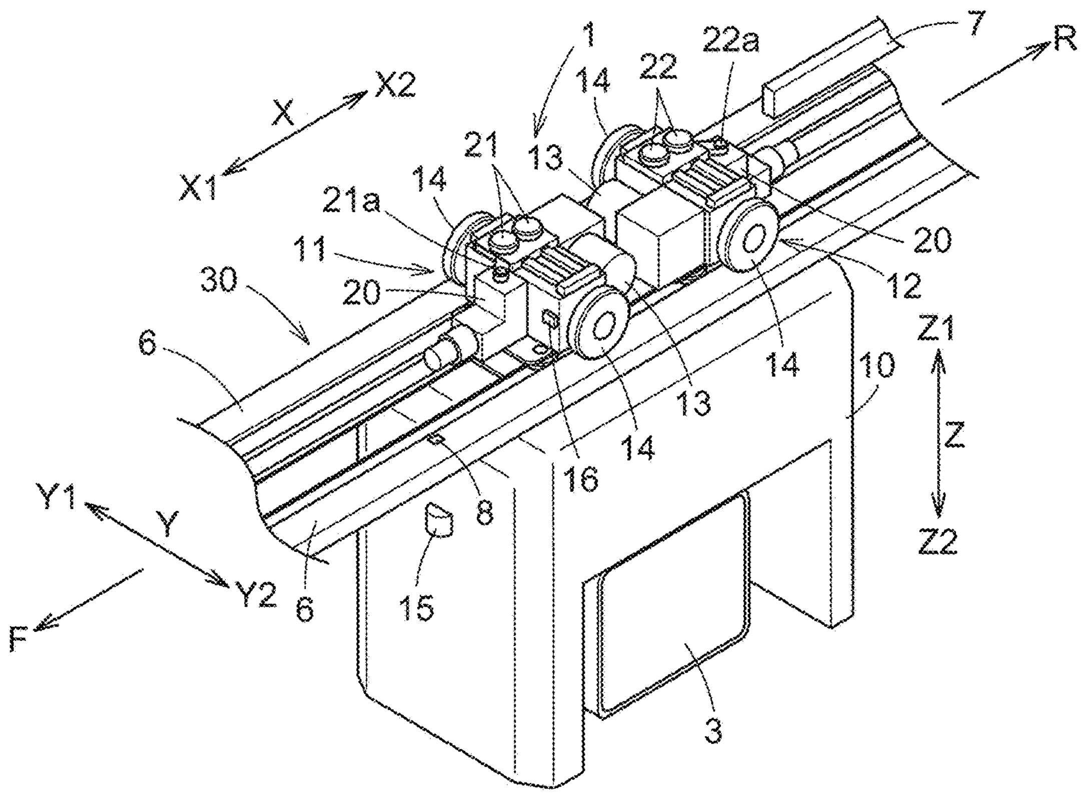
FIG. 2 shows an example of a transport vehicle.

As shown in FIG. 2, the direction along the travel route 30 is defined as a travel direction X, and the direction orthogonal to the travel direction X (here, horizontal direction orthogonal to the travel direction X) as viewed vertically in an up-down direction Z (vertical direction) is defined as a width direction Y As shown in FIG. 1, a forward direction F is set in each portion of the travel route 30. With the opposite direction to the forward direction F defined as a reverse direction R (see FIG. 2), the transport vehicles 1 generally travel along the travel route 30 in the forward direction F, but travel along the travel route 30 in the reverse direction R when performing return travel described later. That is, the transport vehicles 1 are able to move forward along the travel route 30 in the forward direction F and reverse (move backward) along the travel route 30 in the reverse direction R.

As shown in FIG. 2, the side in the forward direction F along the travel route 30 is defined as a downstream side X1, and the side in the reverse direction R along the travel route 30 is defined as an upstream side X2. The travel direction X, the downstream side X1, and the upstream side X2 can also be referred to as the front-back direction of the transport vehicle 1, the forward side of the transport vehicle 1, and the rearward side of the transport vehicle 1, respectively. Also, one side in the width direction Y (here, right side when facing in the forward direction F) is defined as a first side Y1 in the width direction, and the opposite side in the width direction Y (here, left side when facing in the forward direction F) is defined as a second side Y2 in the width direction.

The transport vehicles 1 transport an article 3 (see FIG. 2) along the travel route 30. The article 3 is, for example, a FOUP (Front Opening Unified Pod) that houses a semiconductor wafer. The transport vehicles 1 are unmanned transport vehicles. The travel route 30 may be formed physically or virtually. In the present embodiment, the travel route 30 is formed physically by a travel rail 6 (here, a pair of travel rails 6 spaced apart from each other in the width direction Y). The travel rails 6 are, for example, suspended from the ceiling.

The travel route 30 in FIG. 2 is assumed to be formed along the ceiling, but the travel route 30 may be formed on a floor surface or the like. When the travel route 30 is formed on a floor surface, the travel route 30 is, for example, physically formed by rails installed on the floor surface, or virtually formed by two-dimensional code, RF (Radio Frequency) tags, or the like installed on the floor surface. Note that the floor surface may be suspended from the ceiling.

As shown in FIG. 2, the transport vehicle 1 includes a first travel section 11 as a travel section. The first travel section 11 includes travel wheels 14 that roll on a travel surface of the travel rails 6 (here, surface facing an upper side Z1), and a travel drive section 13 (e.g., electric motor such as a servomotor) that rotates the travel wheels 14. The first travel section 11 travels along the travel rails 6 due to the travel wheels 14 being rotationally driven by the travel drive section 13. In the present embodiment, the transport vehicle 1 further includes a second travel section 12 on the upstream side X2 of the first travel section 11. The second travel section 12 is configured similarly to the first travel section 11, and travels along the travel rails 6 due to the travel wheels 14 being rotationally driven by the travel drive section 13.

The transport vehicle 1 includes a body portion 10 coupled to the first travel section 11. The article 3 is housed in the body portion 10 for transport by the transport vehicle 1. In the present embodiment, the body portion 10 is supported by the first travel section 11 on a lower side Z2 of the first travel section 11. In the present embodiment, the body portion 10 is coupled to both the first travel section 11 and the second travel section 12, and is supported by the first travel section 11 and the second travel section 12 on the lower side Z2 of the first travel section 11 and the second travel section 12.

In the example shown in FIG. 2, the transport vehicle 1 includes a collision prevention sensor 15 that detects another transport vehicle 1 on the downstream side X1 of the transport vehicle 1. When the collision prevention sensor 15 detects another transport vehicle 1, the transport vehicle 1 equipped with the collision prevention sensor 15 avoids colliding with the other transport vehicle 1 by decelerating, stopping or the like.

As shown in FIG. 2, in the present embodiment, an information holding body 8 such as two-dimensional code or an RF tag is installed at a plurality of locations along the travel route 30. The information holding bodies 8 are, for example, installed at places where the transport vehicles 1 can stop such as stations, a branch standby position P1 (see FIG. 3), a merge standby position P3 (see FIG. 4) described later, or places serving as a determination reference for controlling the transport vehicles 1 such as an exit determination position P5 (see FIG. 4) described later. The information holding bodies 8 hold position information relating to the position where the information holding bodies 8 are installed. The transport vehicles 1 each include a reading device 16 that reads the position information held by the information holding bodies 8, and recognizes its own current position based on the position information read by the reading device 16. The transport vehicle 1 recognizes its own current position based on, for example, the position information read by the reading device 16 and the distance travelled from where the reading device 16 read the position information. The travel distance of the transport vehicle 1 is measured using a rotary encoder, for example. Note that the transport vehicle 1 can be configured to recognize its own current position, based on the output of a positioning device such as a GNSS (Global Navigation Satellite System) receiver.

The control system 2 grasps the current position of each of the transport vehicles 1. In the present embodiment, each transport vehicle 1 recognizes its own current position as described above, and the control system 2 grasps the current position of each of the transport vehicles 1 by acquiring information on the current positions of the transport vehicles 1 from the respective transport vehicles 1.

A plurality of stations are set on the travel route 30, and, at each station, the articles 3 are transferred between the transport vehicles 1 and an article support section provided in the station. The operations of the transport vehicles 1 include a travel operation for traveling along the travel route 30, an operation for receiving the article 3 from the article support section at the stations, and an operation for unloading the article 3 to the article support section at the stations. The transport vehicles 1 travel to a station serving as a transport source and receive the articles 3 at the transport source station, and then travel to a station serving as a transport destination and unload the articles 3 at the transport destination station.

The article support sections each include, for example, a loading port of a processing device 4 (see FIG. 1) that processes the articles 3 (or objects housed in the articles 3), an entry/exit port of a storage device 5 (see FIG. 1) that stores the articles 3, and a storage rack (not shown) where the articles 3 are temporarily stored. The article support sections are, for example, disposed directly below the travel route 30 at the stations.

As shown in FIG. 2, the guide rail 7 is provided in some segments of the travel route 30. In the present embodiment, the guide rail 7 is disposed on the upper side Z1 of the travel rails 6. Also, in the present embodiment, the guide rail 7 is disposed between the pair of travel rails 6 that are spaced apart in the width direction Y as viewed vertically.

The transport vehicles 1 each include a guide section that is guided by the guide rail 7 by contacting the guide rail 7 from one side in the width direction Y, and the guide drive section 20 (e.g., solenoid or electric motor) that moves the guide section in the width direction Y Movement of the guide section in the width direction Y by the guide drive section 20 is, for example, performed by driving only the guide section in the width direction Y, or by driving the guide section in the width direction Y together with a support portion that supports the guide section.

In the present embodiment, the first travel section 11 includes a first guide wheel 21 that rotates (here, freely rotates) around an axis extending in the up-down direction Z as the guide section, and the guide drive section 20 provided in the first travel section 11 moves the first guide wheel 21 in the width direction Y In the example shown in FIG. 2, the first travel section 11 includes two first guide wheels 21 aligned in the travel direction X, and the guide drive section 20 moves these two first guide wheels 21 in the width direction Y, by moving the support portion of these two first guide wheels 21 in the width direction Y.

Also, in the present embodiment, the second travel section 12 includes a second guide wheel 22 that rotates (here, freely rotates) around an axis extending in the up-down direction Z as the guide section, and the guide drive section 20 provided in the second travel section 12 moves the second guide wheel 22 in the width direction Y In the example shown in FIG. 2, the second travel section 12 includes two second guide wheels 22 aligned in the travel direction X, and the guide drive section 20 moves these two second guide wheels 22 in the width direction Y, by moving the support portion of these two second guide wheels 22 in the width direction Y Hereinafter, when describing matters common thereto, the first guide wheels 21 and the second guide wheels 22 will be referred to as guide wheels 21 and 22 without distinguishing therebetween. In the present embodiment, the first guide wheels 21 and the second guide wheels 22 each corresponds to the "guide section".

Figures 5, 6:
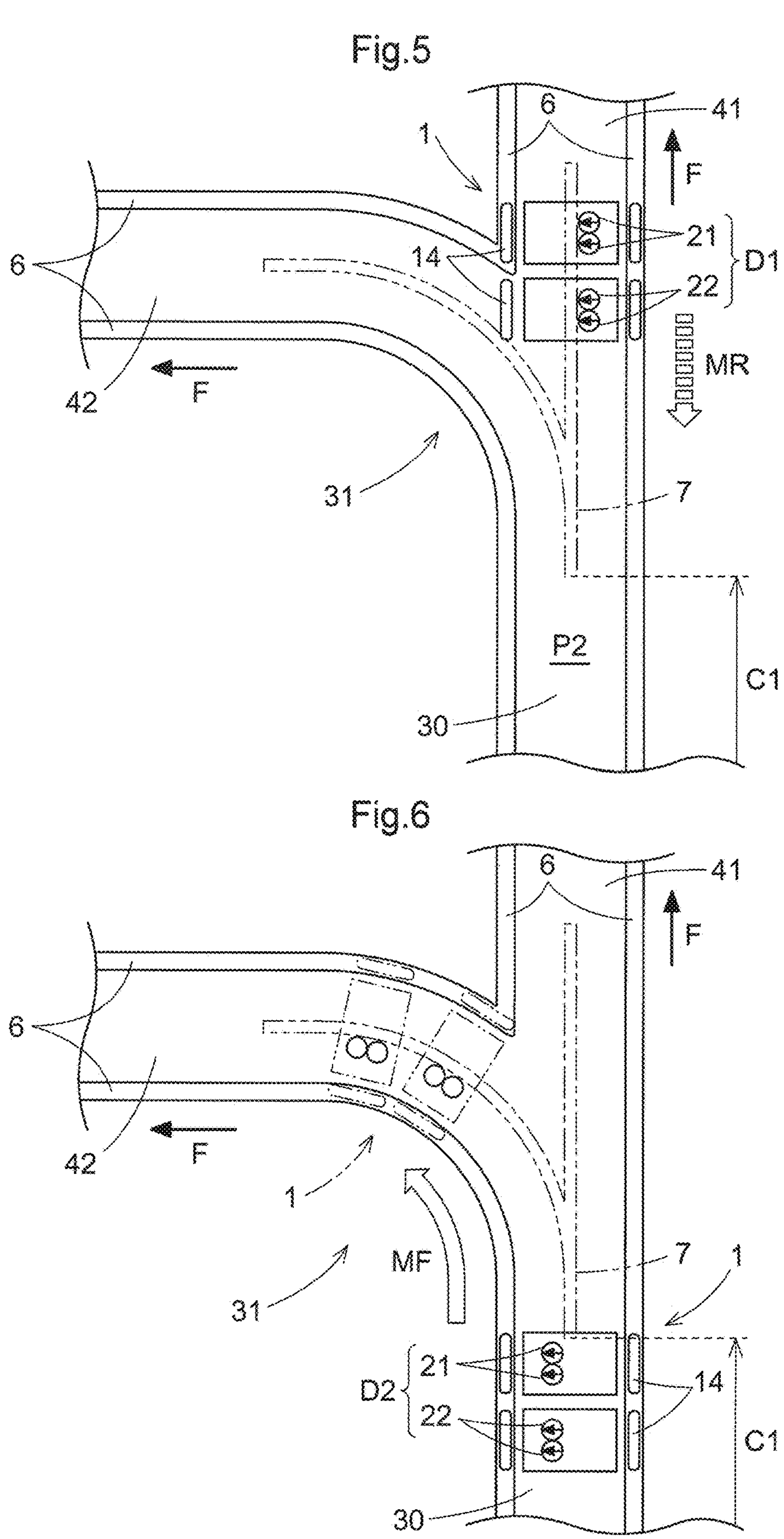
FIG. 5 illustrates branch return control.
FIG. 6 illustrates branch return control.

As shown in FIGS. 5 and 6, in the present embodiment, the travel route 30 has a branch portion 31 that branches from a single route into a first branch route 41 and a second branch route 42. The first branch route 41 may be either the route that branch to the right or the route that branches to the left in the branch portion 31. In the examples shown in FIGS. 5 and 6, the first branch route 41 branches to the right and the second branch route 42 branches to the left in the branch portion 31.

Figures 7, 8:
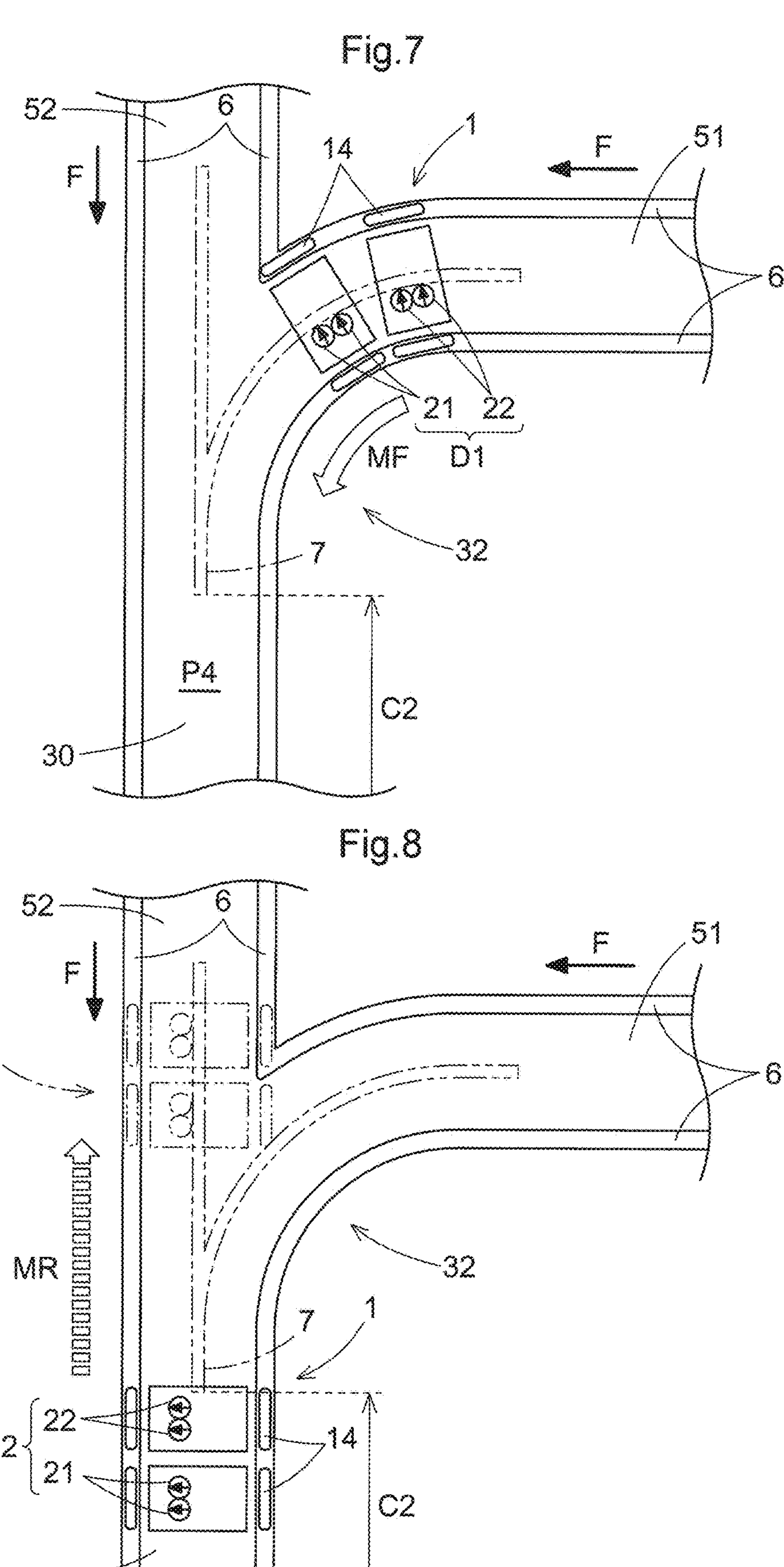
FIG. 7 illustrates merge return control.
FIG. 8 illustrates merge return control.

As shown in FIGS. 7 and 8, in the present embodiment, the travel route 30 has a merge portion 32 where a first merge route 51 and a second merge route 52 merge into a single route. The first merge route 51 may be either the route that merges from the right or the route that merges from left in the merge portion 32. In the examples shown in FIGS. 7 and 8, the first merge route 51 merges from left and the second merge route 52 merges from right in the merge portion 32.

The above-described forward direction F is the travel direction in which the branch portion 31 branches (see FIGS. 5 and 6), and the travel direction in which the merge portion 32 merges (see FIGS. 7 and 8). Also, the reverse direction R is the travel direction in which the branch portion 31 merges, and the travel direction in which the merge portion 32 branches. As shown in FIG. 2, the reverse direction R, the travel direction X, the downstream side X1, the upstream side X2, the width direction Y, the first side Y1 (here, right side) in the width direction, and the second side Y2 (here, left side) in the width direction are determined, based on the forward direction F, and, in FIGS. 5 to 8, these indicators are omitted and only the forward direction F is shown.

As shown in FIGS. 5 and 6, the guide rail 7 is provided in the branch portion 31 and is not provided in a branch upstream segment C1 on the upstream side X2 of the branch portion 31. The guide rail 7 is also not provided in segments of the first branch route 41 and the second branch route 42 on the downstream side X1 of the branch portion 31. The guide rail 7 is provided in the branch portion 31 to branch into a portion along the first branch route 41 and a portion along the second branch route 42 toward the downstream side X1.

As shown in FIGS. 7 and 8, the guide rail 7 is provided in the merge portion 32 and is not provided in a merge downstream segment C2 on the downstream side X1 of the merge portion 32. The guide rail 7 is also not provided in segments of the first merge route 51 and the second merge route 52 on the upstream side X2 of the merge portion 32. The guide rail 7 is provided in the merge portion 32 to branch into a portion along the first merge route 51 and a portion along the second merge route 52 toward the upstream side X2.

Whether the transport vehicle 1 proceeds along the first branch route 41 or the second branch route 42 in the branch portion 31 is determined according to the position of the guide wheels 21 and 22 in the width direction Y when the transport vehicle 1 enters the branch portion 31. Specifically, when the guide wheels 21 and 22 are positioned to contact the guide rail 7 from the first side Y1 in the width direction when the transport vehicle 1 enters the branch portion 31, the transport vehicle 1 proceeds along the branch route on the first side Y1 in the width direction (first branch route 41 in branch portion 31 shown in FIG. 5). Also, when the guide wheels 21 and 22 are positioned to contact the guide rail 7 from the second side Y2 in the width direction when the transport vehicle 1 enters the branch portion 31, the transport vehicle 1 proceeds along the branch route on the second side Y2 in the width direction (second branch route 42 in branch portion 31 shown in FIG. 5). Before the transport vehicle 1 enters the branch portion 31, the guide drive section 20 moves the guide wheels 21 and 22 to a position in the width direction Y that depends on the branch route to be proceeded along.

The position of the guide wheels 21 and 22 in the width direction Y when the transport vehicle 1 enter the merge portion 32 is determined according to whether the transport vehicle 1 enters the merge portion 32 from the first merge route 51 or the second merge route 52. Specifically, when the transport vehicle 1 enters the merge portion 32 from the merge route merging from the first side Y1 in the width direction (second merge route 52 in merge portion 32 shown in FIG. 7), the guide wheels 21 and 22 are moved to contact the guide rail 7 from the first side Y1 in the width direction. Also, when the transport vehicle 1 enters the merge portion 32 from the merge route merging from the second side Y2 in the width direction (first merge route 51 in merge portion 32 shown in FIG. 7), the guide wheels 21 and 22 are moved to contact the guide rail 7 from the second side Y2 in the width direction. Before the transport vehicle 1 enters the merge portion 32, the guide drive section 20 moves the guide wheels 21 and 22 to a position in the width direction Y that depends on the merge route to be traveled.

As shown in FIG. 5, in the present embodiment, when the transport vehicle 1 proceeds along the right branch route (here, first branch route 41) in the branch portion 31, the left travel rail 6 is interrupted, and when the transport vehicle 1 proceeds along the left branch route (here, second branch route 42) in the branch portion 31, the right travel rail 6 is interrupted. Also, as shown in FIG. 7, in the present embodiment, when the transport vehicle 1 enters the merge portion 32 from the right merge route (here, second merge route 52), the left travel rail 6 is interrupted, and when the transport vehicle 1 enters the merge portion 32 from the left merge route (here, first merge route 51), the right travel rail 6 is interrupted.

The transport vehicle 1 travels through the place where the right or left travel rail 6 is interrupted as described above, with only the travel wheels 14 on one side in the width direction Y in contact with the travel rails 6. The guide wheels 21 and 22 are positioned to contact the guide rail 7 from the side in the width direction Y on which the travel rails 6 are not interrupted.

Specifically, the transport vehicle 1 travels through the place where the travel rail 6 on the second side Y2 in the width direction (here, left side) is interrupted, in a state where the travel wheels 14 on the first side Y1 in the width direction (here, right side) contact the travel rail 6, and the guide wheels 21 and 22 are positioned to contact the guide rail 7 from the first side Y1 in the width direction. In this state, the load of the transport vehicle 1 is borne by the travel rail 6 that the travel wheels 14 on the first side Y1 in the width direction come into contact with and by the guide rail 7. Also, the transport vehicle 1 travels through the place where the travel rail 6 on the first side Y1 in the width direction (here, right side) is interrupted, in a state where the travel wheels 14 on the second side Y2 in the width direction (here, left side) contact the travel rail 6, and the guide wheels 21 and 22 are positioned to contact the guide rail 7 from the second side Y2 in the width direction. In this state, the load of the transport vehicle 1 is borne by the travel rail 6 that the travel wheels 14 on the second side Y2 in the width direction come into contact with and by the guide rail 7.

In the present embodiment, the transport vehicle 1 includes a movement detection section that detects movement of the guide wheels 21 and 22 in the width direction Y The control system 2 detects that the guide wheels 21 and 22 have moved in the width direction Y during branch return control or merge return control described later, by acquiring the results of the movement detection section detecting movement of the guide wheels 21 and 22 in the width direction Y.

The movement detection section detects movement of the guide wheels 21 and 22 in the width direction Y, by detecting the position of the guide wheels 21 and 22 or the position of the support portion of the guide wheels 21 and 22 in the width direction Y, for example. The movement detection section may also detect movement of the guide wheels 21 and 22 in the width direction Y, by detecting the movement of the guide wheels 21 and 22 or the support portion of the guide wheels 21 and 22. In this case, the movement detection section detects movement of the guide wheels 21 and 22 or the support portion of the guide wheels 21 and 22, by detecting change in the torque of a motor constituting the guide drive section 20, for example.

In the present embodiment, the transport vehicle 1 includes a first movement detection section 21*a* that detects movement of the first guide wheels 21 in the width direction Y and a second movement detection section 22*a* that detects movement of the second guide wheels 22 in the width direction Y as the movement detection section. The first movement detection section 21*a* is provided in the first travel section 11, and the second movement detection section 22*a* is provided in the second travel section 12.

As shown in FIGS. 5 and 6, the position of the guide wheels 21 and 22 in the width direction Y for entering the first branch route 41 is defined as a first position D1, and the position of the guide wheels 21 and 22 in the width direction Y for entering the second branch route 42 is defined as a second position D2. In the branch portion 31 shown in FIGS. 5 and 6, the position at which the guide wheels 21 and 22 contact the guide rail 7 from the first side Y1 (here, right side) in the width direction is the first position D1, and the position at which the guide wheels 21 and 22 contact the guide rail 7 from the second side Y2 (here, left side) in the width direction is the second position D2.

The control system 2 executes branch return control when controlling the transport vehicle 1 traveling on the first branch route 41 to perform return travel (hereinafter, referred to as "branch return travel") for entering the second branch route 42 after reversing. In the branch return control, the guide drive section 20 is controlled to move the guide wheels 21 and 22 located at the first position D1 to the second position D2 side while the transport vehicle 1 is reversing on the first branch route 41, and the transport vehicle 1 is moved forward on condition that the guide wheels 21 and 22 have moved to the second position D2. In the present embodiment, in the branch return control, the transport vehicle 1 is moved forward on condition that both the first guide wheels 21 and the second guide wheels 22 have moved to the second position D2. Here, "moved forward on condition" includes both a configuration in which the transport vehicle 1 is moved forward when the above condition is satisfied and a configuration in which the transport vehicle 1 is moved forward when another condition is also satisfied in addition to the above condition. In the present embodiment, the control system 2 move the transport vehicle 1 forward when the guide wheels 21 and 22 (here, both the first guide wheels 21 and the second guide wheels 22) have moved to the second position D2.

In the case where, when controlling the transport vehicle 1 to perform branch return travel, the transport vehicle 1 is located on the first branch route 41 on the downstream side X1 of the segment where the guide rail 7 is provided, the control system 2 controls the guide drive section 20 to move the guide wheels 21 and 22 located at the first position D1 to the second position D2 side after the transport vehicle 1 whose guide wheels 21 and 22 are located at the first position D1 reverses to the segment where the guide rail 7 is provided. This processing for controlling the guide drive section 20 to move the guide wheels 21 and 22 located at the first position D1 to the second position D2 side is continued until the guide wheels 21 and 22 move to the second position D2.

Branch return control will now be specifically described, with reference to FIGS. 5 and 6. FIG. 5 shows a transport vehicle 1 performing a reverse operation MR on the first branch route 41, and FIG. 6 shows the transport vehicle 1 performing a forward operation MF and entering the second branch route 42 at a later time than FIG. 5. In FIGS. 5 and 6, the arrows shown inside the guide wheels 21 and 22 indicate that the guide wheels 21 and 22 are being urged in the direction of the arrows by the guide drive section 20. In FIG. 5, the position at which the guide wheels 21 and 22 of the transport vehicle 1 move from the first position D1 to the second position D2 during branch return travel is indicated by a branch return position P2. At the branch return position P2, the end of the first branch route 41 on the upstream side X2 and the end of the second branch route 42 on the upstream side X2 are connected to each other.

As shown in FIG. 5, while the transport vehicle 1 is reversing in the segment of the first branch route 41 where the guide rail 7 is provided, the guide wheels 21 and 22 are in contact with the guide rail 7 from the first position D1 side. Thus, even when the guide drive section 20 is controlled to move the guide wheels 21 and 22 located at the first position D1 to the second position D2 side, the guide wheels 21 and 22 do not move to the second position D2 side despite being urged to move to the second position D2 side. Note that the magnitude of the force applied by the guide drive section 20 urging the guide wheels 21 and 22 to move to the second position D2 side is not sufficient to move the guide wheels 21 and 22 to the second position D2 side while the guide wheels 21 and 22 are in contact with the guide rail 7 from the first position D1 side.

Then, as shown in FIG. 6, when the transport vehicle 1 reverses to the branch upstream segment C1 where the guide rail 7 is not provided, or in other words, when the transport vehicle 1 reverses to the branch return position P2, the guide wheels 21 and 22 move to the second position D2 due to the force applied by the guide drive section 20 urging the guide wheels 21 and 22 to move to the second position D2 side. The control system 2 controls the transport vehicle 1 to move forward on condition that the guide wheels 21 and 22 have thus moved to the second position D2. In the present embodiment, the direction in which the transport vehicle 1 travels is switched from reverse to forward at the branch return position P2. The transport vehicle 1 then moves forward with the guide wheels 21 and 22 located at the second position D2, and the transport vehicle 1 thus enters the second branch route 42, as shown in FIG. 6.

As shown in FIGS. 7 and 8, the position of the guide wheels 21 and 22 in the width direction Y while the transport vehicle 1 is traveling on the first merge route 51 is defined as a first position D1, and the position of the guide wheels 21 and 22 in the width direction Y while the transport vehicle 1 is traveling on the second merge route 52 is defined as a second position D2. In the merge portion 32 shown in FIGS. 7 and 8, the position where the guide wheels 21 and 22 contact the guide rail 7 from the second side Y2 (here, left side) in the width direction is the first position D1, and the position where the guide wheels 21 and 22 contact the guide rail 7 from the first side Y1 in the width direction (here, right side) is the second position D2.

The control system 2 executes merge return control when controlling the transport vehicle 1 traveling on the first merge route 51 to perform return travel (hereinafter, referred to as "merge return travel") for entering the second merge route 52 after moving forward. In the merge return control, the guide drive section 20 is controlled to move the guide wheels 21 and 22 located at the first position D1 to the second position D2 side while the transport vehicle 1 is moving forward on the first merge route 51, and the transport vehicle 1 is reversed on condition that the guide wheels 21 and 22 have moved to the second position D2. Here, "reversed on condition" includes both a configuration in which the transport vehicle 1 is reversed when the above condition is satisfied and a configuration in which the transport vehicle 1 is reversed when another condition is also satisfied in addition to the above condition. In the present embodiment, the control system 2 reverses the transport vehicle 1 when the guide wheels 21 and 22 (here, both the first guide wheels 21 and the second guide wheels 22) have moved to the second position D2.

In the case where, when controlling the transport vehicle 1 to perform merge return travel, the transport vehicle 1 is located on the first merge route 51 on the upstream side X2 of the segment where the guide rail 7 is provided, the control system 2 controls the guide drive section 20 to move the guide wheels 21 and 22 located at the first position D1 to the second position D2 side after the transport vehicle 1 whose guide wheels 21 and 22 are located at the first position D1 moves forward to the segment where the guide rail 7 is provided. This processing of controlling the guide drive section 20 to move the guide wheels 21 and 22 located at the first position D1 to the second position D2 side is continued until the guide wheels 21 and 22 move to the second position D2.

Merge return control will now be specifically described with reference to FIGS. 7 and 8. FIG. 7 shows a transport vehicle 1 performing a forward operation MF on the first merge route 51, and FIG. 8 shows the transport vehicle 1 performing a reverse operation MR and entering the second merge route 52 at a later time than FIG. 7. In FIGS. 7 and 8, the arrows shown inside the guide wheels 21 and 22 indicate that the guide wheels 21 and 22 are being urged in the direction of the arrows by the guide drive section 20. In FIG. 7, the position at which the guide wheels 21 and 22 of the transport vehicle 1 move from the first position D1 to the second position D2 during merge return travel is indicated by a merge return position P4. At the merge return position P4, the end of the first merge route 51 on the downstream side X1 and the end of the second merge route 52 on the downstream side X1 are connected to each other.

As shown in FIG. 7, while the transport vehicle 1 is moving forward in the segment of the first merge route 51 where the guide rail 7 is provided, the guide wheels 21 and 22 are in contact with the guide rail 7 from the first position D1 side. Thus, even when the guide drive section 20 is controlled to move the guide wheels 21 and 22 located at the first position D1 to the second position D2 side, the guide wheels 21 and 22 do not move to the second position D2 side despite being urged to move to the second position D2 side. Note that the magnitude of the force applied by the guide drive section 20 urging the guide wheels 21 and 22 to move to the second position D2 side is not sufficient to move the guide wheels 21 and 22 to the second position D2 side while the guide wheels 21 and 22 are in contact with the guide rail 7 from the first position D1 side.

Then, as shown in FIG. 8, when the transport vehicle 1 moves forward to the merge downstream segment C2 where the guide rail 7 is not provided, or in other words, when the transport vehicle 1 moves forward to the merge return position P4, the guide wheels 21 and 22 move to the second position D2 due to the force applied by the guide drive section 20 urging the guide wheels 21 and 22 to move to the second position D2 side. The control system 2 controls the transport vehicle 1 to reverse on condition that the guide wheels 21 and 22 have thus moved to the second position D2. In the present embodiment, the direction in which the transport vehicle 1 travels is switched from forward to reverse at the merge return position P4. The transport vehicle 1 then reverses with the guide wheels 21 and 22 located at the second position D2, and the transport vehicle 1 thus enters the second merge route 52, as shown in FIG. 8.

Figures 3, 4:
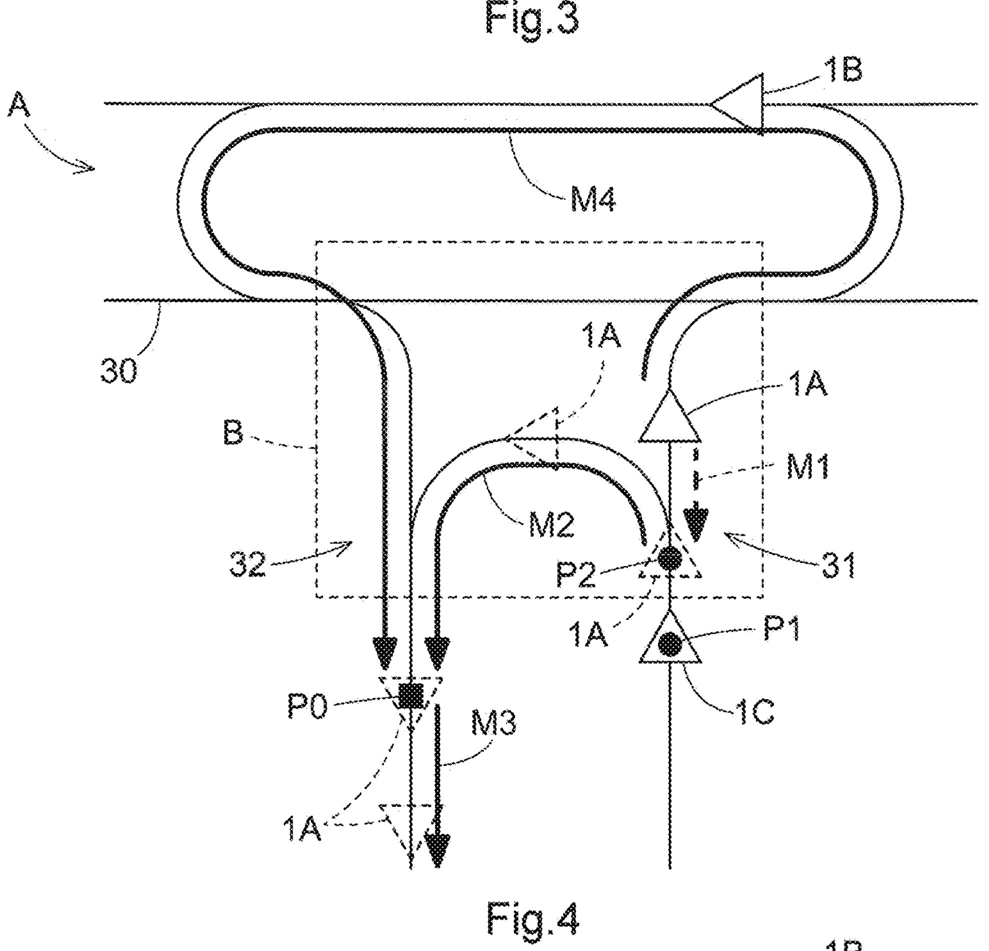
FIG. 3 shows an example of return travel
FIG. 4 shows another example of return travel.

FIG. 3 is an enlarged view of area A in FIG. 1. Three transport vehicles 1, namely, a first transport vehicle 1A, a second transport vehicle 1, and a third transport vehicle 1C, are shown in FIG. 3. FIG. 3 shows a situation in which the first transport vehicle 1A performs branch return travel in the branch portion 31. In FIG. 3, the first transport vehicle 1A performs, in the stated order, a first travel operation M1 for reversing from the current position to the branch return position P2, a second travel operation M2 for moving forward from the branch return position P2 to a destination P0 described later, and a third travel operation M3 for moving forward from the destination P0. Note that, by performing a fourth travel operation M4 for moving forward from the current position to the destination P0, the first transport vehicle 1A is also able to travel to the destination P0 by only moving forward.

In FIG. 3 and also FIG. 4 referred to later, travel operations in which the transport vehicle 1 moves forward are indicated by solid arrows, and travel operations in which the transport vehicle 1 reverses are indicated by dashed arrows. Also, in FIGS. 3 and 4, the area including the branch portion 31 and the merge portion 32 is a branch-merge area B. The control system 2 ensures that the transport vehicles 1 do not interfere with each other in the branch-merge area B, by controlling the transport vehicles 1 such that two or more transport vehicles 1 are not present within the branch-merge area B at the same time, for example.

When one of the transport vehicles 1 (first transport vehicle 1A in FIG. 3) is in the branch portion 31, the control system 2 executes branch standby control for controlling another transport vehicle 1 (third transport vehicle 1C in FIG. 3) that is going to enter the branch portion 31 to standby at a predetermined branch standby position P1. The control system 2 then sets the branch standby position P1 to a position on the upstream side X2 of the transport vehicle 1 located at the branch return position P2, such that the transport vehicle 1 located at the branch standby position P1 does not interfere with the transport vehicle 1 that arrives at the branch return position P2. In the present embodiment, the control system 2 sets the branch standby position P1 in advance to a position where interference will not occur with the transport vehicle 1 that arrives at the branch return position P2, and, when executing branch standby control, controls the transport vehicle 1 (third transport vehicle 1C in FIG. 3) subject to the branch standby control to standby at the preset branch standby position P1. Note that the range of the branch portion 31 for determining whether a transport vehicle 1 is present in the branch portion 31 can be any range that includes the branch portion 31 (e.g., branch-merge area B including the branch portion 31), and the branch standby position P1 is set outside the range of the branch portion 31.

FIG. 4 is an enlarged view of area A in FIG. 1, similar to FIG. 3. Four transport vehicles 1, namely, a first transport vehicle 1A, a second transport vehicle 1B, a third transport vehicle 1C, and a fourth transport vehicle 1D, are shown in FIG. 4. FIG. 4 shows a situation in which the first transport vehicle 1A performs branch return travel in the branch portion 31 and then merge return travel in the merge portion 32. In FIG. 4, the first transport vehicle 1A performs, in the stated order, a fifth travel operation M5 for reversing from the current position to the branch return position P2, a sixth travel operation M6 for moving forward from the branch return position P2 to the merge return position P4, a seventh travel operation M7 for reversing from the merge return position P4 to the destination P0, and an eighth travel operation M8 for moving forward from the destination P0. Note that, by performing a ninth travel operation M9 for moving forward from the current position to the destination P0, the first transport vehicle 1A is also able to travel to the destination P0 by only moving forward.

When one of the transport vehicles 1 (first transport vehicle 1A in FIG. 4) is in the merge portion 32, the control system 2 executes merge standby control for controlling another transport vehicle 1 (third transport vehicle 1C and fourth transport vehicle 1D in FIG. 4) that is going to enter the merge portion 32 to standby at a predetermined merge standby position P3. In the present embodiment, the control system 2 sets the merge standby position P3 in advance to a position on the upstream side X2 (two positions in FIG. 4) of the merge portion 32, and, when executing merge standby control, controls the transport vehicle 1 (third transport vehicle 1C and fourth transport vehicle 1D in FIG. 4) subject to the merge standby control to standby at the preset merge standby position P3. The control system 2 then sets, on the downstream side X1 of the merge return position P4, the exit determination position P5, which is the position at which it is determined that the transport vehicle 1 in the merge portion 32 has exited the merge portion 32. In the present embodiment, the control system 2 sets the exit determination position P5 in advance to a position on the downstream side X1 of the merge return position P4. Note that the range of the merge portion 32 for determining whether a transport vehicle 1 is present in the merge portion 32 can be any range that includes the merge portion 32 (e.g., branch-merge area B including the merge portion 32), and the merge standby position P3 and the exit determination position P5 are set outside the range of the merge portion 32.

When the destination P0 is set, the control system 2 selects one of the transport vehicles 1 as a selected transport vehicle to be moved toward the destination P0. The following considers the case where the transport source station from which the articles 3 are transported is the destination P0. In this case, the transport source station serving as the destination P0 is designated by a transport task for transporting the articles 3 from the transport source station to the transport destination station, for example. The transport task is generated by the control system 2 or by another device (e.g., host control device of control system 2) capable of communicating with the control system 2.

The control system 2 takes transport vehicles 1 (hereinafter, referred to as "empty transport vehicles") that are not transporting the article 3 as candidates for the selected transport vehicle. Note that transport vehicles 1 that are transporting the article 3 (hereinafter, referred to as "loaded transport vehicles") can also be included as candidates for the selected transport vehicle. In this case, when a loaded transport vehicle is selected as the selected transport vehicle, the loaded transport vehicle proceeds to the destination P0 after unloading the article 3 being transported at the transport destination station.

In the present embodiment, when selecting the selected transport vehicle (transport vehicle 1 to be moved toward the destination P0) from among the transport vehicles 1, the control system 2, selects, as the selected transport vehicle, a transport vehicle 1 that incurs the lowest cost (route cost) which is determined, for each transport vehicle 1, according to the distance from the position of the transport vehicle 1 to the destination P0 and the travel conditions of the transport vehicle 1. The route cost is derived to decrease as the predicted value of the travel time required for the transport vehicle 1 to travel to the destination P0 decreases. The route costs of the transport vehicles 1 are derived by Dijkstra's algorithm, for example. By selecting the transport vehicle 1 that incurs the smallest route cost as the selected transport vehicle, it is possible to control one of the transport vehicles 1 to quickly reach the destination P0.

The travel conditions of the transport vehicles 1 include, for example, at least one of the travel direction of the transport vehicle 1 (whether moving forward or in reverse), the degree of congestion on the route, the structure of the route (e.g., straight segment, curved segment, branch segment through branch portion 31, merge segment through merge portion 32), the number of stations on the route, and the state of the transport vehicle 1 (e.g., whether empty or loaded). For example, in a segment in which a maintenance lifter for lowering transport vehicles 1 to the ground from the travel route 30 formed on the ceiling is connected in order to perform maintenance on the transport vehicles 1, the degree of congestion of the segment increases due to the presence of transport vehicles 1 moving toward the maintenance lifter or transport vehicles 1 that have been returned to the travel route 30 by the maintenance lifter.

The route cost is derived to increase as the distance from the position (current position) of the transport vehicle 1 to the destination P0 increases. Also, the route cost is derived to increase when the travel condition of the transport vehicle 1 is a condition where the required travel time of the transport vehicle 1 becomes longer. For example, when the degree of congestion on the route is included in the travel conditions of the transport vehicle 1, the route cost is derived to increase as the congestion on the route increases.

In the present embodiment, the route cost is obtained by adding the segment costs of all segments included in the route from the position (current position) of the transport vehicle 1 to the destination P0. The segment cost of each segment can be calculated by multiplying a basic cost that depends on the length of the segment by a correction coefficient that is determined according to the travel conditions of the transport vehicle 1 in the segment. The basic cost is set to increase as the segment for which the basic cost is set increases in length. The correction coefficient is set to increase when the travel condition of the transport vehicle 1 in the segment for which the correction coefficient is set is a condition where the transit time required for the transport vehicle 1 to pass through the segment becomes longer. Although not described in detail, the travel route 30 can be represented using nodes and links connecting the nodes. Nodes correspond to specific points such as the branch portion 31 and the merge portion 32, and the links correspond to route portions connecting the specific points. In this case, the above segment cost can be the cost of a segment corresponding to a link (link cost).

In the present embodiment, the cost (route cost) is set higher when the transport vehicle 1 reverses than when the transport vehicle 1 moves forward. Specifically, in the present embodiment, by setting the correction coefficient to be higher when the transport vehicle 1 reverses than when the transport vehicle 1 moves forward, the route cost is set higher when the transport vehicle 1 reverses than when the transport vehicle 1 moves forward. Thus, in the present embodiment, given the same conditions (e.g., given the same travel distance), a transport vehicle 1 that reaches the destination P0 only by moving forward is preferentially selected as the selected transport vehicle. For example, when the above-described collision prevention sensor 15 (see FIG. 2) is only provided on the downstream side X1 (front side) of the transport vehicle 1, the need can arise for the traveling speed of the transport vehicle 1 when reversing to be lower than the traveling speed of the transport vehicle 1 when moving forward. In such a case, the route cost is favorably set to increase more when the transport vehicle 1 reverses than when the transport vehicle 1 is only moving forward, and a transport vehicle 1 that reaches the destination P0 only by moving forward is preferentially selected as the selected transport vehicle.

In the present embodiment, the candidates for the selected transport vehicle include transport vehicles 1 that reach the destination P0 by performing return travel. In the present embodiment, return travel includes both branch return travel and merge return travel. Therefore, the candidates for the selected transport vehicle include transport vehicles 1 that reach the destination P0 by performing branch return travel, transport vehicles 1 that reach the destination P0 by performing merge return travel, and transport vehicles 1 that reach the destination P0 by performing both branch return travel and merge return travel.

By thus including transport vehicles 1 that reach the destination P0 by performing return travel as candidates for the selected transport vehicle, the possibility being able to control one of the transport vehicles 1 to quickly reach the destination P0 can be enhanced. For example, in the situation shown in FIG. 3, assume that the first transport vehicle 1A and the second transport vehicle 1B are empty transport vehicles. In this case, when the candidates for the selected transport vehicle do not include transport vehicles 1 that reach the destination P0 by performing return travel, the second transport vehicle 1B is selected as the selected transport vehicle. On the other hand, in the case where, when the candidates for the selected transport vehicle include transport vehicles 1 that reach the destination P0 by performing return travel, the route cost incurred in the case where the first transport vehicle 1A performs branch return travel (first travel operation M1 and second travel operation M2) to reach the destination P0 is less than the route cost incurred in the case where the second transport vehicle 1B moves forward to the destination P0, the first transport vehicle 1A is selected as the selected transport vehicle. In this case, it is possible to control one of the transport vehicles 1 (here, first transport vehicle 1A) to reach the destination P0 faster than when the second transport vehicle 1B is selected as the selected transport vehicle.

Also, in the situation shown in FIG. 4, for example, assume that the first transport vehicle 1A and the second transport vehicle 1B are empty transport vehicles. In this case, when the candidates for the selected transport vehicle do not include transport vehicles 1 that reach the destination P0 by performing return travel, the second transport vehicle 1B is selected as the selected transport vehicle. On the other hand, in the case where, when the candidates for the selected transport vehicle include transport vehicles 1 that reach the destination P0 by performing return travel, the route cost incurred in the case where the first transport vehicle 1A performs branch return travel (fifth travel operation M5, sixth travel operation M6, and seventh travel operation M7) to reach the destination P0 is less than the route cost incurred in the case where the second transport vehicle 1B moves forward to the destination P0, the first transport vehicle 1A is selected as the selected transport vehicle. In this case, it is possible to control one of the transport vehicles 1 (here, first transport vehicle 1A) to reach the destination P0 faster than when the second transport vehicle 1B is selected as the selected transport vehicle.

Other Embodiments (1) In the above embodiment, the control system 2 controls the transport vehicles 1 to perform both branch return travel and merge return travel. However, the present disclosure is not limited to such a configuration, and the control system 2 can also be configured to control the transport vehicles 1 to perform only branch return travel or merge return travel.

(2) In the above embodiment, the cost (route cost) is set higher for a transport vehicle 1 that reverses than for a transport vehicle 1 that moves forward. However, the present disclosure is not limited to such a configuration, and a difference in cost need not be provided between the case where the transport vehicle 1 moves forward and the case where the transport vehicle 1 reverses.

(3) In the above embodiment, the transport vehicles 1 include the first guide wheels 21 and the second guide wheels 22. However, the present disclosure is not limited to such a configuration, and the transport vehicles 1 can also include only the first guide wheels 21 (e.g., the transport vehicles 1 are not provided with the second travel section 12).

(4) In the above embodiment, the first travel section 11 includes the first guide wheels 21 as a guide section and the second travel section 12 includes the second guide wheels 22 as a guide section. However, the present disclosure is not limited to such a configuration, and the first travel section 11 and the second travel section 12 can also include a guide section (e.g., member that is guided by sliding along the guide rail 7) having a different form to guide wheels.

(5) Note that the configurations disclosed in the above-described embodiments can also be applied in combination with configurations disclosed in other embodiments (including combinations of embodiments described as other embodiments) as long as there are no inconsistencies. With respect to these other configurations, the embodiments disclosed herein are merely illustrative in all respects. Accordingly, various modifications can be made as appropriate, without departing from the spirit of the present disclosure.

SUMMARY OF THE EMBODIMENT

Hereinafter, a summary of the transport facility illustrated above will be described.

As one mode, the transport facility includes at least one transport vehicle configured to travel along a travel route, a guide rail provided along the travel route, and a control system configured to control the at least one transport vehicle. When a direction along the travel route is defined as a travel direction, and a direction orthogonal to the travel direction as viewed vertically is defined as a width direction, the at least one transport vehicle includes a guide section configured to be guided by the guide rail by contacting the guide rail from one side in the width direction, and a guide drive section configured to move the guide section in the width direction. The travel route includes a branch portion branching from a single route into a first branch route and a second branch route, the guide rail is provided in the branch portion and is not provided in a branch upstream segment upstream of the branch portion, and the at least one transport vehicle is configured to perform forward movement for traveling along the travel route in a forward direction and reverse movement for traveling along the travel route in a reverse direction to the forward direction. Also, when a position of the guide section in the width direction for entering the first branch route is defined as a first position, and a position of the guide section in the width direction for entering the second branch route is defined as a second position, the control system, when controlling the at least one transport vehicle traveling on the first branch route to perform return travel for entering the second branch route after reversing, executes branch return control for (i) controlling the guide drive section to move the guide section located at the first position to the second position side while the at least one transport vehicle is reversing on the first branch route, and (ii) controlling the at least one transport vehicle to move forward on condition that the guide section has moved to the second position.

In a configuration in which the guide rail is provided in the branch portion and is not provided in the branch upstream segment, it is necessary, when controlling the transport vehicle traveling on the first branch route to perform return travel for entering the second branch route after reversing, to control the transport vehicle traveling on the first branch route to reverse back to the branch upstream segment, in order to switch the position of the guide section in the width direction from the first position to the second position. According to this configuration, when the transport vehicle is controlled to perform the above-described return travel, the guide drive section is controlled to move the guide section located at the first position to the second position side while the transport vehicle is reversing on the first branch route. Thus, when the transport vehicle enters the branch upstream segment and the guide rail ends, the guide section moves from the first position to the second position. That is, with a relatively simple configuration in which the guide drive section is controlled to move the guide section located at the first position to the second position side while the transport vehicle is reversing on the first branch route, the guide section can be moved to the second position when near the downstream end of the branch upstream segment. The transport vehicle is then controlled to move forward on condition that the guide section has thus moved to the second position. Accordingly, the direction in which the transport vehicle travels is readily switched from reverse to forward at a position near the downstream end of the branch upstream segment, and the travel distance of the transport vehicle during return travel is readily kept short. According to this configuration, it is thus possible to realize a transport facility in which the travel distance of transport vehicles during return travel is readily kept short.

Here, preferably the at least one transport vehicle includes a plurality of the transport vehicles, and, in response to one of the transport vehicles being in the branch portion, the control system executes branch standby control for controlling another of the transport vehicles that is going to enter the branch portion to standby at a predetermined branch standby position. Also, when a position at which the guide section of the transport vehicle performing the return travel moves from the first position to the second position is defined as a branch return position, preferably the control system sets the branch standby position to a position upstream of the transport vehicle located at the branch return position, such that the transport vehicle located at the branch standby position does not interfere with the transport vehicle that arrives at the branch return position.

According to this configuration, it is possible to ensure that a situation in which a transport vehicle standing by at a branch standby position obstructs a transport vehicle present in the branch portion from performing return travel is unlikely to occur.

As another mode, the transport facility includes at least one transport vehicle configured to travel along a travel route, a guide rail provided along the travel route, and a control system configured to control the at least one transport vehicle. When a direction along the travel route is defined as a travel direction, and a direction orthogonal to the travel direction as viewed vertically is defined as a width direction, the at least one transport vehicle includes a guide section configured to be guided by the guide rail by contacting the guide rail from one side in the width direction, and a guide drive section configured to move the guide section in the width direction. The travel route includes a merge portion where a first merge route and a second merge route merge into a single route, the guide rail is provided in the merge portion and is not provided in a merge downstream segment downstream of the merge portion, and the at least one transport vehicle is configured to perform forward movement for traveling along the travel route in a forward direction and reverse movement for traveling along the travel route in a reverse direction to the forward direction. Also, when a position of the guide section in the width direction for traveling on the first merge route is defined as a first position, and a position of the guide section in the width direction for traveling on the second merge route is defined as a second position, the control system, when controlling the at least one transport vehicle traveling on the first merge route to perform return travel for entering the second merge route after moving forward, executes merge return control for (i) controlling the guide drive section to move the guide section located at the first position to the second position side while the at least one transport vehicle is moving forward on the first merge route, and (ii) controlling the at least one transport vehicle to reverse on condition that the guide section has moved to the second position.

In a configuration in which the guide rail is provided in the merge section and is not provided in the merge downstream segment, it is necessary, when controlling the transport vehicle traveling on the first merge route to perform return travel for entering the second merge route after moving forward, to control the transport vehicle traveling on the first merge route to move forward to the merge downstream segment, in order to switch the position of the guide section in the width direction from the first position to the second position. According to this configuration, when the transport vehicle is controlled to perform the above-described return travel, the guide drive section is controlled to move the guide section located at the first position to the second position side while the transport vehicle is moving forward on the first merge route. Thus, when the transport vehicle enters the merge downstream segment and the guide rail ends, the guide section moves from the first position to the second position. That is, with a relatively simple configuration in which the guide drive section is controlled to move the guide section located at the first position to the second position side while the transport vehicle is moving forward on the first merge route, the guide section can be moved to the second position when near the upstream end of the merge downstream segment. The transport vehicle is then controlled to reverse on condition that the guide section has thus moved to the second position. Accordingly, the direction in which the transport vehicle travels is readily switched from forward to reverse at a position near the upstream end of the merge downstream segment, and the travel distance of the transport vehicle during return travel is readily kept short. According to this configuration, it is thus possible to realize a transport facility in which the travel distance of transport vehicles during return travel is readily kept short.

Here, preferably the at least one transport vehicle includes a plurality of the transport vehicles, and, in response to one of the transport vehicles being in the merge portion, the control system executes merge standby control for controlling another of the transport vehicles that is going to enter the merge portion to standby at a predetermined merge standby position. Also, when a position at which the guide section of the transport vehicle performing the return travel moves from the first position to the second position is defined as a merge return position, preferably the control system sets a position on a downstream side of the merge return position as an exit determination position where it is determined that the transport vehicle in the merge portion has exited the merge portion.

According to this configuration, it is possible to ensure that a situation in which it is determined that a transport vehicle (hereinafter, referred to as the "target transport vehicle") that is performing return travel in the merge portion has exited the merge portion and another transport vehicle enters the merge portion and obstructs the target transport vehicle in the merge portion from performing the return travel is unlikely to occur.

In the transport facility having the above configuration, preferably the control system is configured to select, as a selected transport vehicle to be moved toward a destination, from among the transport vehicles, the transport vehicle that incurs a smallest cost determined, for each transport vehicle, according to a distance from a position of the transport vehicle to the destination and a travel condition of the transport vehicle, and the transport vehicle that reaches the destination by performing the return travel is included as a candidate for the selected transport vehicle.

According to this configuration, when selecting one of the transport vehicles to be moved toward a destination as a selected transport vehicle, an appropriate transport vehicle that depends on the distances from the positions of the respective transport vehicles to the destination and the travel conditions of the respective transport vehicles can be selected as a selected transport vehicle. According to this configuration, a transport vehicle that could possibly be able to reach the destination by performing return travel is also included as a candidate for the selected transport vehicle. Accordingly, the possibility of being able to control one of the transport vehicles to quickly reach the destination can be enhanced, compared to when transport vehicles that perform return travel are excluded from being candidates for the selected transport vehicle.

In the configuration in which the transport vehicle that reaches the destination by performing the return travel is included as a candidate for the selected transport vehicle, as described above, preferably the cost is set higher in a case of the transport vehicle that reverses than in a case of the transport vehicle that moves forward.

According to this configuration, the cost incurred in the case where the transport vehicle reverses is set higher than the cost incurred in the case where the transport vehicle moves forward, and thus, given the same distance to the destination, for example, a transport vehicle that moves forward to reach the destination can be preferentially selected as the selected transport vehicle. Accordingly, the need to wait for or avoid other transport vehicles in order for a transport vehicle to reverse is reduced, and the transport efficiency of the entire transport facility is readily enhanced.

A transport facility according to the present disclosure need only achieve at least one of the above-described effects.

What is claimed is:

1. A transport facility comprising:

at least one transport vehicle configured to travel along a travel route;

a guide rail provided along the travel route; and a control system configured to control the at least one transport vehicle, and wherein:

a direction along the travel route is defined as a travel direction, and a direction orthogonal to the travel direction as viewed vertically is defined as a width direction, the at least one transport vehicle comprises:

a guide section configured to be guided by the guide rail by contacting the guide rail from one side in the width direction; and a guide drive section configured to move the guide section in the width direction, the travel route comprises a branch portion branching from a single route into a first branch route and a second branch route, the guide rail is provided in the branch portion and not being provided in a branch upstream segment upstream of the branch portion, the at least one transport vehicle is configured to perform forward movement for traveling along the travel route in a forward direction and reverse movement for traveling along the travel route in a reverse direction to the forward direction, and when a position of the guide section in the width direction for entering the first branch route is defined as a first position, and a position of the guide section in the width direction for entering the second branch route is defined as a second position, the control system, when controlling the at least one transport vehicle traveling on the first branch route to perform return travel for entering the second branch route after reversing, executes branch return control for (i) controlling the guide drive section to move the guide section located at the first position to the second position side while the at least one transport vehicle is reversing on the first branch route, and (ii) controlling the at least one transport vehicle to move forward on condition that the guide section has moved to the second position.

2. The transport facility according to claim 1, wherein:

the at least one transport vehicle comprises a plurality of the transport vehicles, in response to one of the transport vehicles being in the branch portion, the control system executes branch standby control for controlling another of the transport vehicles that is going to enter the branch portion to standby at a predetermined branch standby position, and when a position at which the guide section of the transport vehicle performing the return travel moves from the first position to the second position is defined as a branch return position, the control system sets the branch standby position to a position upstream of the transport vehicle located at the branch return position, such that the transport vehicle located at the branch standby position does not interfere with the transport vehicle that arrives at the branch return position.

3. The transport facility according to claim 1, wherein the control system is configured to select, as a selected transport vehicle to be moved toward a destination, from among the transport vehicles, the transport vehicle that incurs a smallest cost determined, for each transport vehicle, according to a distance from a position of the transport vehicle to the destination and a travel condition of the transport vehicle, and wherein the transport vehicle that reaches the destination by performing the return travel is included as a candidate for the selected transport vehicle.

4. The transport facility according to claim 3, wherein the cost is set higher in a case of the transport vehicle that reverses than in a case of the transport vehicle that moves forward.

5. A transport facility comprising:

at least one transport vehicle configured to travel along a travel route;

a guide rail provided along the travel route; and a control system configured to control the at least one transport vehicle, and wherein:

a direction along the travel route is defined as a travel direction, and a direction orthogonal to the travel direction as viewed vertically is defined as a width direction, the at least one transport vehicle comprises:

a guide section configured to be guided by the guide rail by contacting the guide rail from one side in the width direction; and a guide drive section configured to move the guide section in the width direction, the travel route comprises a merge portion where a first merge route and a second merge route merge into a single route, the guide rail is provided in the merge portion and not provided in a merge downstream segment downstream of the merge portion, the at least one transport vehicle is configured to perform forward movement for traveling along the travel route in a forward direction and reverse movement for traveling along the travel route in a reverse direction to the forward direction, and when a position of the guide section in the width direction for traveling on the first merge route is defined as a first position, and a position of the guide section in the width direction for traveling on the second merge route is defined as a second position, the control system, when controlling the at least one transport vehicle traveling on the first merge route to perform return travel for entering the second merge route after moving forward, executes merge return control for (i) controlling the guide drive section to move the guide section located at the first position to the second position side while the at least one transport vehicle is moving forward on the first merge route, and (ii) controlling the at least one transport vehicle to reverse on condition that the guide section has moved to the second position.

6. The transport facility according to claim 5, wherein:

the at least one transport vehicle comprises a plurality of the transport vehicles, in response to one of the transport vehicles being in the merge portion, the control system executes merge standby control for controlling another of the transport vehicles that is going to enter the merge portion to standby at a predetermined merge standby position, and when a position at which the guide section of the transport vehicle performing the return travel moves from the first position to the second position is defined as a merge return position, the control system sets a position on a downstream side of the merge return position as an exit determination position where it is determined that the transport vehicle in the merge portion has exited the merge portion.

7. The transport facility according to claim 5, wherein the control system is configured to select, as a selected transport vehicle to be moved toward a destination, from among the transport vehicles, the transport vehicle that incurs a smallest cost determined, for each transport vehicle, according to a distance from a position of the transport vehicle to the destination and a travel condition of the transport vehicle, and wherein the transport vehicle that reaches the destination by performing the return travel is included as a candidate for the selected transport vehicle.

8. The transport facility according to claim 7, wherein the cost is set higher in a case of the transport vehicle that reverses than in a case of the transport vehicle that moves forward.

* * * * *